(12) United States Patent
Bednar et al.

(10) Patent No.: US 7,146,596 B2
(45) Date of Patent: Dec. 5, 2006

(54) INTEGRATED CIRCUIT CHIP HAVING A RINGED WIRING LAYER INTERPOSED BETWEEN A CONTACT LAYER AND A WIRING GRID

(75) Inventors: Thomas R. Bednar, Essex Junction, VT (US); Timothy W. Budell, Milton, VT (US); Patrick H. Buffet, Essex Junction, VT (US); Alain Caron, South Burlington, VT (US); James V. Crain, Jr., Milton, VT (US); Douglas W. Kemerer, Essex Junction, VT (US); Donald S. Kent, Colchester, VT (US); Esmaeil Rahmati, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 10/604,995

(22) Filed: Aug. 29, 2003

(65) Prior Publication Data
US 2005/0050505 A1    Mar. 3, 2005

(51) Int. Cl.
*G06F 17/50* (2006.01)
*H01L 23/52* (2006.01)
(52) U.S. Cl. ............... 716/12; 716/5; 716/8; 716/13; 257/700; 257/758
(58) Field of Classification Search ............... 716/5, 716/10, 12, 13, 17; 257/207, 276, 390, 409, 257/509, 529, 758; 361/301.2; 438/601; 703/17
See application file for complete search history.

(56) References Cited

U.S. PATENT DOCUMENTS

| | | | |
|---|---|---|---|
| 4,811,082 A * | 3/1989 | Jacobs et al. | 257/700 |
| 5,040,144 A | 8/1991 | Pelley et al. | |
| 5,145,800 A | 9/1992 | Arai et al. | |
| 5,272,645 A | 12/1993 | Kawakami et al. | |
| 5,283,753 A * | 2/1994 | Schucker et al. | 716/17 |
| 5,396,100 A * | 3/1995 | Yamasaki et al. | 257/390 |
| 5,404,310 A * | 4/1995 | Mitsuhash | 716/13 |

(Continued)

OTHER PUBLICATIONS

Increased Chip Wireability Through More Efficient Power Distribution, IBM Technical Disclosure Bulletin, vol. 38, No. 09, pp. 243-245, Sep. 1995.

Primary Examiner—A. M. Thompson
Assistant Examiner—Helen Rossoshek
(74) Attorney, Agent, or Firm—Downs Rachlin Martin PLLC

(57) ABSTRACT

An integrated circuit chip having a contact layer that includes a plurality of Vdd, Vddx, ground and I/O contacts arranged in a generally radial pattern having diagonal and major axis symmetry and generally defining four quadrants. A multilayer X-Y power grid is located beneath the contact layer. A wiring layer is interposed between the contact layer and power grid to provide a well-behaved electrical transition between the generally radial Vdd, Vddx and ground contacts and the rectangular X-Y power grid. The interposed wiring layer includes concentric square rings of Vdd, Vddx and ground wires located alternatingly with one another. The Vddx wires are discontinuous between adjacent quadrants so that the magnitude of Vddx may be different in each quadrant of the chip if desired.

17 Claims, 4 Drawing Sheets

U.S. PATENT DOCUMENTS

| | | | |
|---|---|---|---|
| 5,614,743 A * | 3/1997 | Mochizuki | 257/276 |
| 5,670,802 A * | 9/1997 | Koike | 257/207 |
| 5,793,643 A | 8/1998 | Cai | |
| 5,824,570 A * | 10/1998 | Aoki et al. | 438/128 |
| 5,923,089 A | 7/1999 | Yao et al. | |
| 5,978,572 A | 11/1999 | Toyonaga et al. | |
| 6,002,857 A | 12/1999 | Ramachandran | |
| 6,028,440 A | 2/2000 | Roethig et al. | |
| 6,035,111 A | 3/2000 | Suzuki et al. | |
| 6,182,272 B1 | 1/2001 | Andreev et al. | |
| 6,184,477 B1 | 2/2001 | Tanahashi | |
| 6,185,722 B1 | 2/2001 | Darden et al. | |
| 6,202,191 B1 | 3/2001 | Filippi et al. | |
| 6,404,026 B1 * | 6/2002 | Tsuyuki | 257/409 |
| 6,445,564 B1 * | 9/2002 | Naitoh | 361/301.2 |
| 6,538,912 B1 * | 3/2003 | Takemura et al. | 365/63 |
| 6,539,530 B1 * | 3/2003 | Torii | 716/12 |
| 6,567,967 B1 * | 5/2003 | Greidinger et al. | 716/10 |
| 6,594,811 B1 * | 7/2003 | Katz | 716/12 |
| 6,638,845 B1 * | 10/2003 | Kagiwata | 438/601 |
| 6,756,675 B1 * | 6/2004 | Tanaka | 257/758 |
| 6,763,511 B1 * | 7/2004 | Banno et al. | 716/12 |
| 6,829,754 B1 * | 12/2004 | Yu et al. | 716/5 |
| 6,876,057 B1 * | 4/2005 | Watanabe | 257/529 |
| 6,909,187 B1 * | 6/2005 | Liaw et al. | 257/758 |
| 7,086,024 B1 * | 8/2006 | Hsu et al. | 716/8 |
| 7,089,519 B1 * | 8/2006 | Teig | 716/9 |
| 7,089,523 B1 * | 8/2006 | Teig et al. | 716/12 |
| 2004/0056355 A1 * | 3/2004 | Minami et al. | 257/758 |
| 2004/0080971 A1 * | 4/2004 | Takemura | 365/63 |
| 2005/0087835 A1 * | 4/2005 | Hayashi et al. | 257/509 |

* cited by examiner

- ● I/O CONTACT (14)
- ◐ Vdd CONTACT (18)
- ⊘ Vddx CONTACT (22)
- ⊘ GROUND CONTACT (26)

○ Vdd CONTACT (116)   ⊘ GROUND CONTACT (124)
⊗ Vddx CONTACT (120)  ● I/O CONTACT (128)

INTEGRATED CIRCUIT CHIP HAVING A RINGED WIRING LAYER INTERPOSED BETWEEN A CONTACT LAYER AND A WIRING GRID

BACKGROUND OF INVENTION

1. Field of the Invention

The present invention relates generally to the field of microelectronics. More particularly, the present invention is directed to an integrated circuit chip having a ringed wiring layer interposed between a contact layer and a wiring grid.

2. Background

A large portion of the semiconductor industry is presently devoted to the design and manufacture of application specific integrated circuit chips, or ASIC chips, that are used in many diverse applications, such as devices containing embedded systems. Examples of such devices include computers, cellular telephones, PDAs, thin clients, televisions, radios, domestic appliances, e.g., digital microwave ovens, dishwashers, clothes dryers and the like, automobiles, digital manufacturing, testing and diagnostic equipment and virtually any digital device for consumer or industrial use. Frequently, ASIC chips designed for different applications contain many of the same basic logic, memory and I/O elements, or cells, as one another. However, for different applications these cells may be present in different numbers, arranged differently and have different interconnectivity, among other differences. Examples of cells include RAM, I/O, adder, clock, latches and communication ports, among others.

Since many cell designs are often used repeatedly in creating new ASIC chips, manufacturers have built libraries of these cells. When designing a new ASIC chip, the manufacturer may then retrieve the necessary cells from the library and combine them with one another, and perhaps with custom-designed cells, in the manner needed for a particular application. Important purposes for creating libraries containing standard cells are to reduce the cost of designing and manufacturing ASIC chips, and to simplify the process of designing ASIC chips.

In a further effort to reduce costs and simplify the design process, manufacturers often complement their cell libraries by standardizing other features of ASIC chips. For example, manufacturers often standardize the type and arrangement of electrical contacts, i.e., power, ground and I/O contacts, for interfacing a completed chip with packaging and standardize the power and ground buses that provide, respectively, power and ground to the microelectronic devices, e.g., transistors, capacitors, diodes, among others, that make up the various cells.

Referring to the drawings, FIGS. 1, 1A, 2, and 3 show a presently used standardized arrangement of electrical contacts and power and ground buses in connection with an exemplary ASIC chip 10. Referring to FIG. 1A, ASIC chip 10 includes at its surface interposed arrays of I/O contacts 14, and power and ground contacts such as Vdd contacts 18, Vddx contacts 22, and ground contacts 26 (e.g., GND, Vref). These contacts may be solder bumps, such as controlled collapse chip connections (C4s) for flip-chip connectivity with a package (not shown). Electrical connectivity of power and ground contacts with a package may be alternatively effected using another technique, such as wire bonding. Such arrays of contacts 14, 18, 22, 26 generally allow ASIC designers to place the necessary cells 28, e.g., RAM cell, I/O cells, logic, and communication port cells, among others, wherever desired on chip 10 such that the cells are always relatively proximate the appropriate contact(s). In the arrangement shown in FIG. 1A, contacts 14, 18, 22, 26 are arranged in generally radial pattern, or pseudo-radial pattern, wherein the contacts in each of the four quadrants of chip 10 have mirror-symmetry along corresponding diagonals D—D, with lines of like contacts radiating outward from the diagonals toward the edge of the chip.

FIG. 2 shows an electrical structure 30 connecting Vdd contacts 18 with a semiconductor device layer 34 that contains the various semiconductor devices (not shown), e.g., transistors, capacitors, diodes, among others, that make up the various cells 28 (FIG. 1A) and other electrical components of chip 10. Electrical bus 30 comprises metal layers LM through (LM-n), interleaved with insulating layers I through (In). Those skilled in the art will understand that the number of metal layers and insulating layers will vary with the particular design and technology used to fabricate the chip. Metal layers LM through (LM-n) are illustrated only for Vdd contacts for clarity. Additional power supplies, such as ground and Vddx, would be connected to similar structures.

FIG. 3 shows conventional metal layers LM and (LM-1) as forming, in plan view, a rectangular bus grid 38 comprising orthogonal conductive strips or wires, 42 and 46, with the wires in each layer all extending in the same direction. That is, all of wires 42 in metal layer LM extend parallel to the X axis and all of wires 46 in metal layer (LM-1) extend parallel to the Y axis. In addition, wires 42 typically have the same widths and spacing as one another and wires 46 typically have the same widths and spacing as one another. For the power grid of chip 10, wires in each of layers LM and (LM-1) include Vdd wires 50, Vddx wires 54, and ground wires 58 interleaved with one another. As illustrated by FIGS. 2 and 3, at each location where like wires cross one another, e.g., one of Vdd wires 42 in metal layer LM crosses over one of Vdd wires 46 in metal layer (LM-1), the wires are electrically connected to one another with a corresponding via 60 extending through insulating layer (I1). Similarly, where a wire in metal layer LM passes beneath, or nearly so, a like contact, e.g., one of Vdd wires 42 in metal layer LM passes directly beneath one of Vdd contacts 18, a via 64, and perhaps also a horizontal strap (not shown), is provided to electrically connect that contact with that wire. As those skilled in the art will appreciate, metal layers beneath (LM-1) are similar to metal layers LM and (LM-1), but may contain progressively finer wires 68. Wires 72 of metal layer (LM-n) are closely spaced from one another so that each device in device layer 34 may be electrically connected thereto.

Area arrays of power and ground contacts 18, 22, 26 and uniform or nearly uniform power and ground grids in metal layers LM through (LM-n) permit designers to lay out the power and ground buses prior to arranging cells 28 (FIG. 1A) in device layer 34. Thus, the power and ground buses may be standardized, in large part eliminating the need to custom design these buses for each new ASIC design. However, problems can arise when electrically connecting power and ground contacts 18, 22, 26 to the corresponding wires 50, 54, 58 in metal layer LM, largely due to the fact that these wires run in only one direction, whereas the power and ground contacts are distributed in two dimensional pseudo-radial patterns. These problems include bussing discontinuities that lead to some regions of chip 10 having reduced ability to supply power to device layer 34 due to electromigration concerns and/or resistive voltage collapse (IR drops). In addition, neither metal layer LM nor metal layer LM-1 connect to a pseudo-radial pattern of contacts in a contact layer above with a regular grid of parallel wires below.

SUMMARY OF INVENTION

In one aspect, the present invention is directed to an integrated circuit having a plurality of circuits that include at least one I/O circuit and at least one logic circuit. The integrated circuit comprises a contact layer having a plurality of contacts for electrically connecting the integrated circuit to packaging. The integrated circuit further comprises a power grid comprising a plurality of metal layers for providing power to the at least one I/O circuit and the at least one logic circuit. A semiconductor device layer is in electrical communication with the power grid. A wiring layer is interposed between the contact layer and the power grid and electrically connects the plurality of contacts with the power grid. The wiring layer includes a plurality of wires each having a length extending partly along a first direction and partly along a second direction different from the first direction.

In another aspect, the present invention is directed to a device comprising a power supply and an integrated circuit having at least one I/O circuit and at least one logic circuit. The integrated circuit comprises a contact layer having a plurality of contacts in electrical communication with the power supply. The integrated circuit further comprises a power grid comprising a plurality of metal layers for providing power to the at least one I/O circuit and the at least one logic circuit. A semiconductor device layer is in electrical communication with the power grid. A wiring layer is interposed between the contact layer and the power grid and electrically connects at least some of the contacts with the power grid. The wiring layer includes a plurality of wires each having a length extending partly along a first direction and partly along a second direction different from the first direction.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 4:
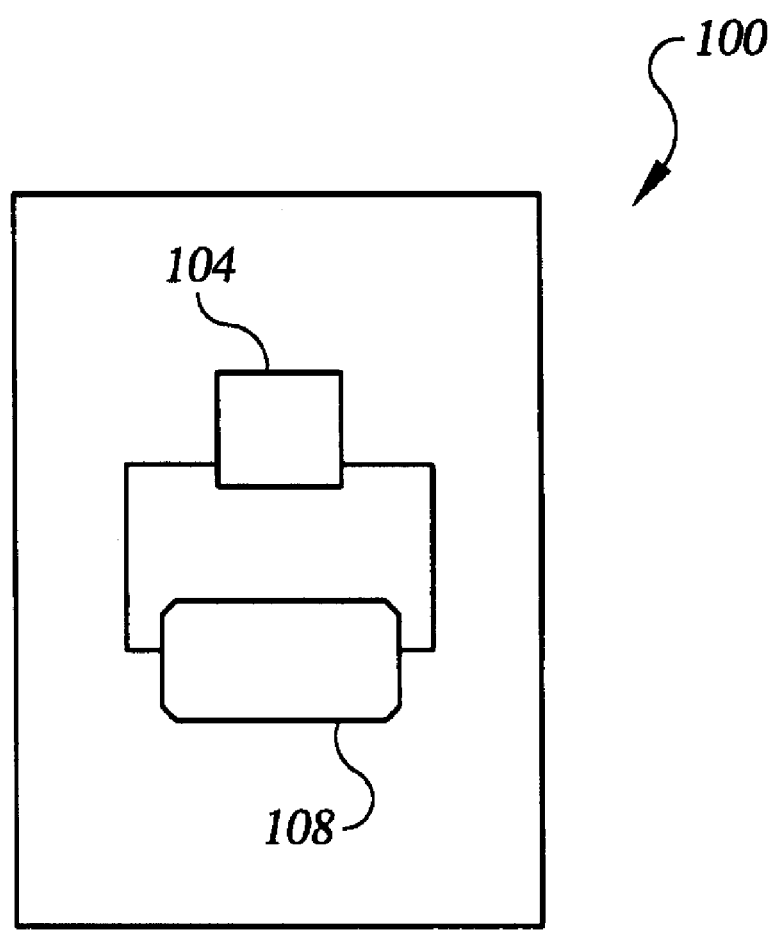
FIG. 4 is a high-level schematic view of a device incorporating an IC chip of the present invention.

Referring again to the drawings, FIG. 4 shows in accordance with the present invention an electronic device, which is generally denoted by the numeral 100. Electronic device 100 may be any type of digital device, such as an embedded system device. Examples of such a device include a computer, a cellular telephone, PDA, thin client, television, radio, domestic appliance, automobile component and digital or analog manufacturing, testing and diagnostic equipment, among others. Accordingly, device 100 includes one or more integrated circuit (IC) chips, such as application specific integrated circuit (ASIC) chip 104, and may also include an onboard power supply 108 for providing power to the IC chip. One skilled in the art will appreciate that in order to understand the present invention it is not necessary to describe the general function of chip 104, nor the details of how the chip interfaces with power supply 108 and other components (not shown) of device 100. In addition, those skilled in the art are familiar with the various functions IC chip 104 may be designed to provide and how to interface the IC chip with power supply 108 and other components.

Figure 1:
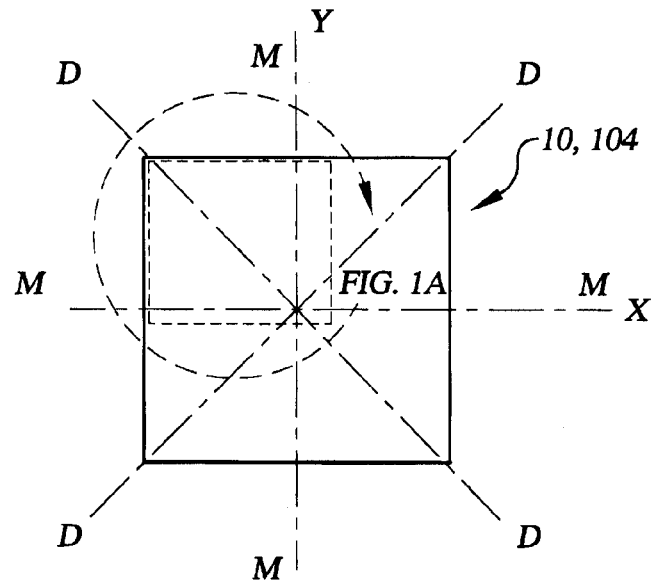
FIG. 1 is a schematic view of an ASIC chip and FIG. 1A is an enlarged schematic view of a portion of the chip of FIG. 1 showing exemplary arrangements of Vdd, Vddx, ground and I/O contacts, and exemplary functional cells, such as logic, memory and I/O cells.
Figure 1A:
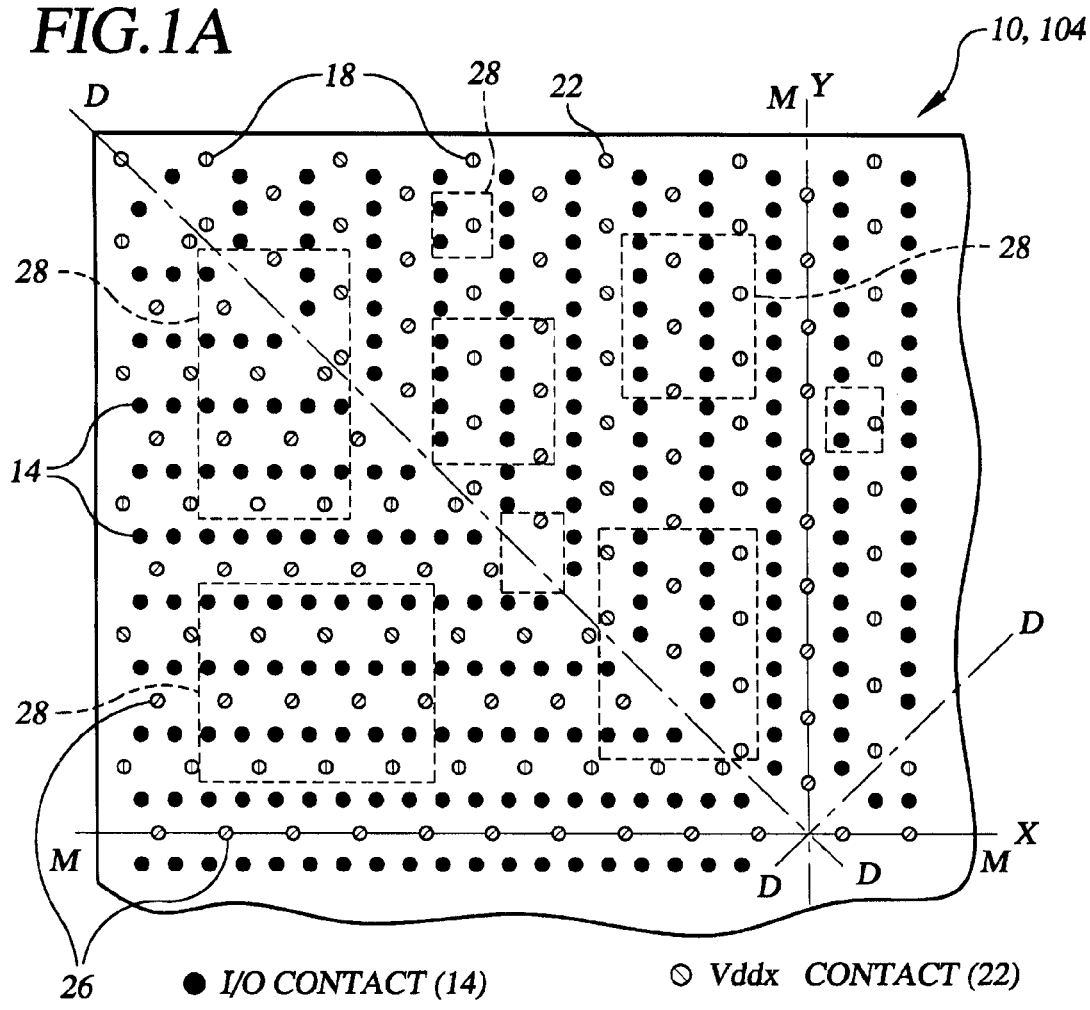
Figure 2:
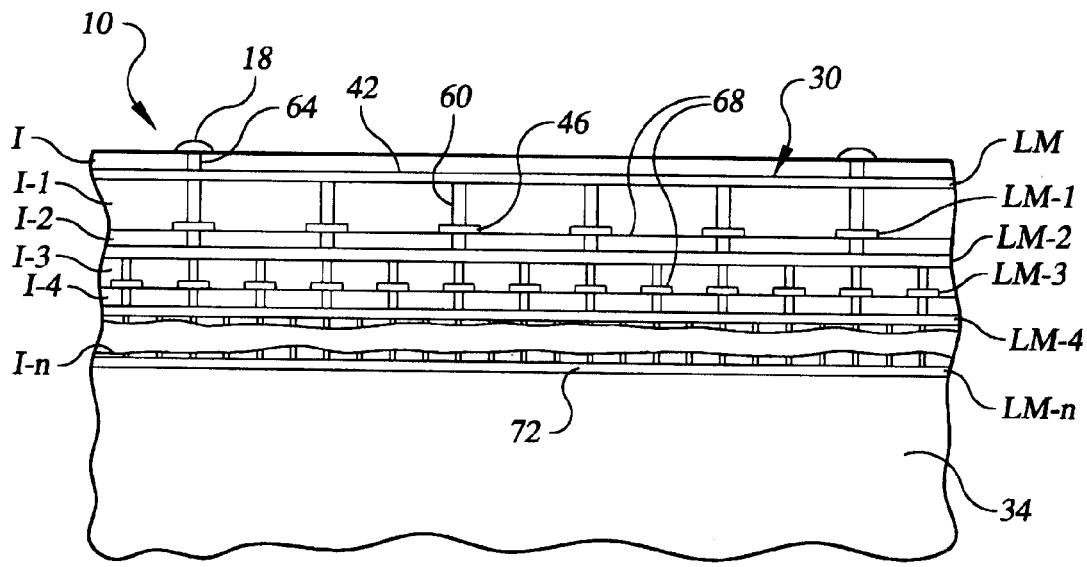
FIG. 2 is a partial cross-sectional elevational view of an ASIC chip showing metal and insulating layers forming a prior art electrical structure.
Figure 5:
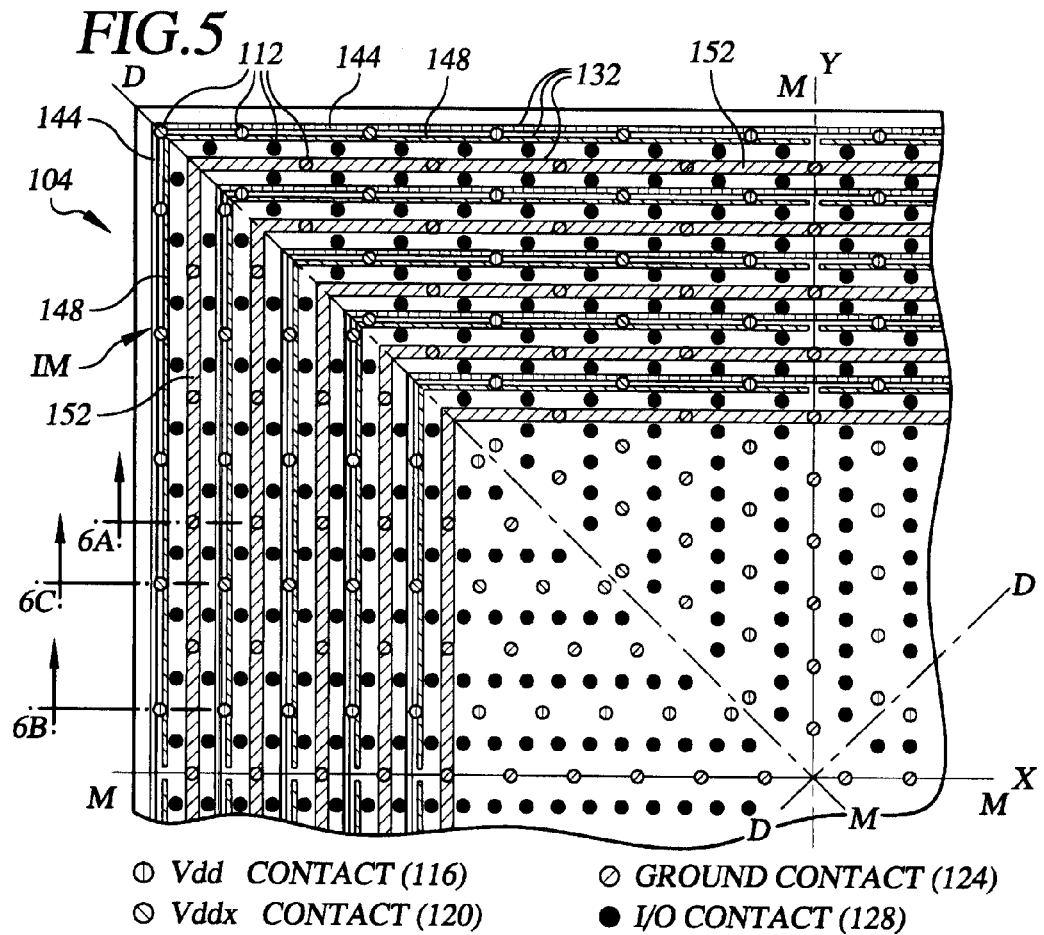
FIG. 5 is a partial schematic plan view of an IC chip of the present invention showing the contact layer and interposing metal layer.

Referring to FIGS. 5 and 6, and also to FIGS. 1A, 2 and 4, chip 104 may include a plurality of electrical contacts 112 for interfacing the chip with chip packaging shown) that allows the chip to be electrically connected to power supply 108 and other components of digital device 100, e.g., using C4 (flip chip) or other connection technology. Electrical contacts 112 may include Vdd contacts 116 for providing power to the semiconductor devices of cells 28 (FIG. 1A) in semiconductor device layer 34 (FIG. 2), Vddx contacts 120 for providing additional voltages to chip 104 to power e.g., external communications, ground contacts 124 for providing the chip with a ground or Vref and I/O contacts 128 for inputting and outputting signals to and from the cells and other components aboard the chip. As shown in FIG. 5, the arrangement of Vdd contacts 116, Vddx contacts 120, ground contacts 124 and I/O contacts 128 of chip 104 may be the same as the arrangement of corresponding contacts 18, 22, 26, 14 of ASIC chip 10 of FIGS. 1 and 1A. Of course, the arrangement of contacts 116, 120, 124, 128 may be different from the arrangement of contacts 18, 22, 26, 14 and may be any arrangement suited for a particular design or standard design philosophy for IC chip 104.

Figure 3:
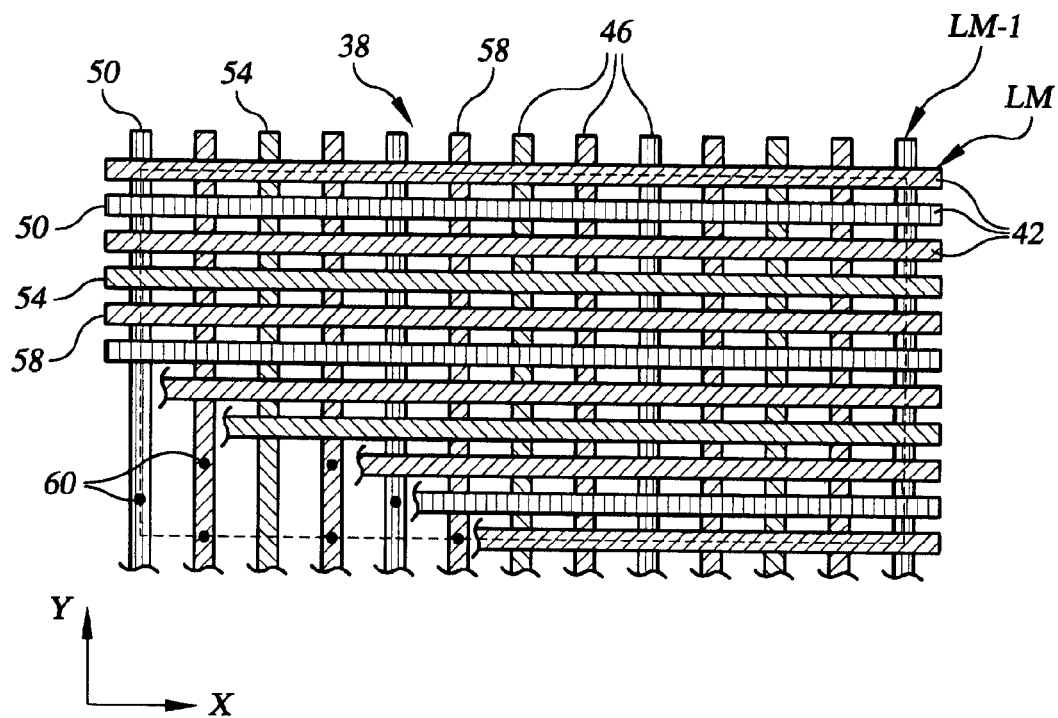
FIG. 3 is a partial schematic plan view of the wires in metal layers LM and (LM-1) of the prior art electrical structure of FIG. 2.

However, unlike chip 10, wherein each of the two uppermost wiring layers LM and (LM-1) contain wires, e.g., wires 42, 46 (FIG. 3), having lengths extending in either the X direction or the Y direction, chip 104 includes an uppermost wiring layer IM ("IM" standing for "interposing metal" layer) that contains wires 132 having lengths extending in more than one direction. For example, FIG. 5 shows the lengths of wires 132 extending in both of the X and Y directions so as to generally form concentric rings. Wiring layer IM may be referred to as an "interposing metal layer" because of its interposing location between contact layer 136 and wiring grid 140 (FIGS. 6A, 6B and 6C), which may comprise a plurality of metal layers (e.g., LM') containing alternating unidirectional wires similar to wires 50, 54, 58 shown in FIG. 3. Note that there is not necessarily a correspondence of wiring layer IM to the metal layers LM and (LM-1) of conventional chip 10 (FIG. 2), i.e., wiring layer IM does not necessarily replace metal layer LM and (LM-1), although this can be the case.

Wiring layer IM may include wiring for electrically connecting Vdd, Vddx and ground contacts 116, 120, 124 with wiring grid 140. Accordingly, wiring layer IM may include Vdd wires 144, Vddx wires 148 and ground wires 152, intermingled with one another in one or more patterns and having one or more configurations suitable for connecting to like contacts 116, 120, 124. For example, wires 144, 148, 152 may be configured generally as rings and may be arranged concentrically with one another. As used herein and in the claims appended hereto, the terms "ring" and "ringed" and similar terms refer to not only an annular shape, but also to generally planar shapes that are continuous or substantially continuous so as to define a continuous or substantially continuous perimeter around a central region lying in the plane of the ring. Thus, wires of interposing wiring layer IM defining rectangular perimeters are considered "rings" for the purposes of the present invention. Of course, other shaped perimeters (e.g., wires 144, 148, 152) are possible and, depending upon the particular pattern(s) of contacts, may be preferred. Other shapes include multi-sided shapes other than the rectangles noted above, e.g., polygonal, or curved shapes, such as circles and ovals, among others. The shapes of the rings selected are generally based upon the patterns of contacts. The square rings shown are particularly suited for the diagonally- and quadrant-symmetric arrangement of contacts shown in FIGS. 1A and 5. For a truly radial arrangement of Vdd, Vddx, and ground contacts 144, 148, 152, and the same square footprint of contact layer 136 shown, a suitable shape for the rings may be octagonal. Similarly, for a pseudo-radial footprint of contacts 144, 148, 152 as in FIG. 1A and orthogonal wires as in FIG. 3, octagonal rings may also be suitable.

Figure 6A:
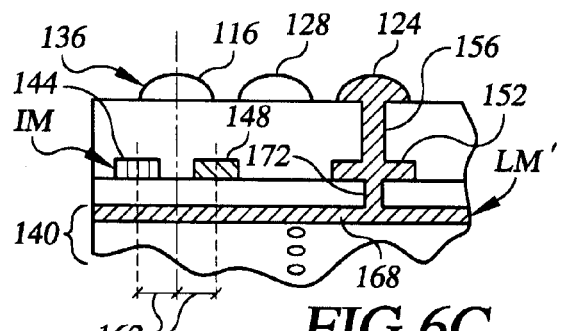
FIGS. 6A, 6B and 6C are each a cross-sectional view of the IC chip of FIG. 5 as taken along lines 6A—6A, 6B—6B and 6C—6C, respectively.
Figure 6B:
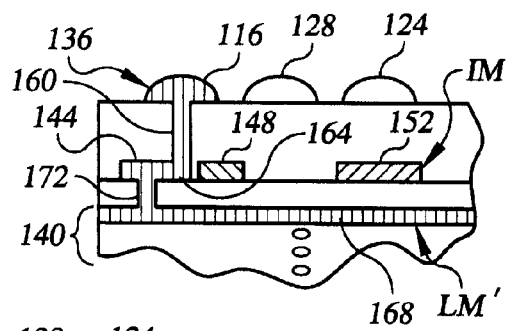
Figure 6C:
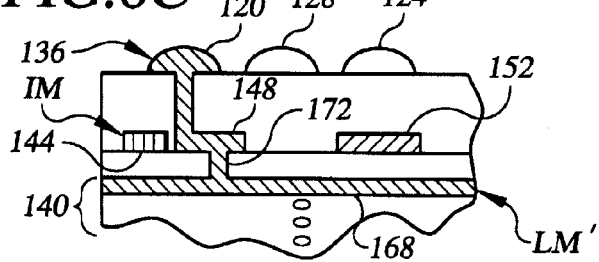

FIGS. 6A–6C illustrate one manner in which power and ground contacts 116, 120, 124 may be electrically connected to corresponding wires 144, 148, 152 of wiring layer IM. It can be seen that in the present arrangement of contacts 116, 120, 124, 128, ground contacts 124 are located such that ground wires 152 can be run directly underneath the ground contacts, if desired. Accordingly, to connect each ground contact 124 to a corresponding ground wire 152, a via 156 may be provided in insulating layer I' in any manner known in the art. However, with the alternating arrangement of Vdd and Vddx contacts 116, 120 along the lengths of Vdd and Vddx wires 144, 148, both of these wires cannot be run directly underneath the corresponding contacts while maintaining the linearity of the wires in each of the X and Y directions. One solution that maintains the linearity of Vdd and Vddx wires 144, 148 is to run them adjacent to one another generally alongside (but in a layer below 116, 124, 128) lines defined by the centers of the Vdd and Vddx contacts 116, 120. The space between Vdd and Vddx wires 144, 148 may be made great enough to allow a via 158, 160 to be located beneath, respectively, each contact 116, 120 concentrically therewith.

With this configuration, each contact 116, 120 will have an offset 162 (FIG. 6A) from the corresponding wire 144, 148. To make up for this offset 162, a strap 164 may be provided to extend the corresponding wire 144, 148 laterally to the side of the corresponding via 158, 160 distal from that wire in order to provide a robust electrical path between each contact 116, 120 and the corresponding wire. Those skilled in the art will understand that this example is merely illustrative and that contacts 116, 120, 124 may be electrically connected to wires 144, 148, 152 in any suitable manner. Wires 144, 148, 152 in wiring layer IM may be electrically connected to corresponding wires 168 in metal layer LM' in any suitable manner, such as by providing vias 172 at locations where like wires in the two layers cross one another. For clarity, wiring and vias are not shown for I/O 128 contacts. Wiring and vias for I/O contacts 128 may be provided in any manner known in the art.

It is noted that the cross-sectional area of each Vdd, Vddx and ground wire 144, 148, 152 and corresponding vias 156, 158, 160 and straps 164, if needed, may be determined according to conventional wire-sizing practices known to those skilled in the art. It is also noted that depending upon the particular design of chip 104 certain ones of wires 144, 148, 152 need not be continuous. For example, in the example shown in FIG. 5, Vddx wires 148 are not continuous between adjacent quadrants of chip 104. In this example, this is done so that the Vddx voltage (for external communication) in each quadrant of chip 104 may be different from the Vddx voltage in the other quadrants, if desired. Again, this is dependent upon the design of chip 104 and the application for which the chip is designed. Wires, 144, 148, 152, contacts 112, vias 156, 158, 160, 172 and straps 164 may be made of any suitable conducting material, such as copper or aluminum.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

The invention claimed is:

1. An integrated circuit having a plurality of circuits that include at least one I/O circuit and at least one logic circuit, comprising:
    a) a contact layer having a plurality of contacts for electrically connecting the integrated circuit to packaging, said plurality of contacts are arranged in a rectangular pattern having major axis symmetry;
    b) a power grid comprising a plurality of metal layers for providing power to the at least one I/O circuit and the at least one logic circuit;
    c) a semiconductor device layer in electrical communication with said power grid; and
    d) a wiring layer interposed between said contact layer and said power grid and electrically connecting said plurality of contacts with said power grid, said wiring layer including a plurality of wires each having a length extending partly along a first direction and partly along a second direction different from said first direction, wherein at least some of said plurality of wires are arranged in concentric rectangular rings.

2. The integrated circuit according to claim 1, wherein said plurality of wires having said ring-shaped configuration are arranged concentrically with one another.

3. The integrated circuit according to claim 1, wherein said plurality of contacts includes a plurality of first contacts and a plurality of second contacts located alternatingly with respect to said plurality of first contacts along a plurality of lines, said plurality of wires including a plurality of first wires and a plurality of second wires wherein each of said plurality of second wires is laterally spaced from a corresponding one of said plurality of first wires, and each of said plurality of first wires is located on one side of a corresponding one of said plurality of lines and a corresponding one of said plurality of second wires is located on the opposite side of said corresponding one of said plurality of lines.

4. The integrated circuit according to claim 1, wherein said at least some of said plurality of wires is arranged in concentric square rings.

5. The integrated circuit according to claim 1, wherein said plurality of wires includes a plurality of Vdd wires and a plurality of ground wires.

6. The integrated circuit according to claim 5, further comprising a plurality of Vddx wires.

7. The integrated circuit according to claim 1, wherein said plurality of contacts are arranged in a square pattern having diagonal symmetry and major axis symmetry, said plurality of wires arranged in concentric square rings.

8. An integrated circuit having a plurality of circuits that include at least one I/O circuit and at least one logic circuit comprising:
   a) a contact layer having a plurality of contacts for electrically connecting the integrated circuit to packaging, said plurality of contacts are arranged in a rectangular pattern having major axis symmetry;
   b) a power grid comprising a plurality of metal layers for providing power to the at least one I/O circuit and the at least one logic circuit;
   c) a semiconductor device layer in electrical communication with said power grid; and
   d) a wiring layer interposed between, and electrically connecting together, said contact layer and said power grid, said wiring layer including a plurality of wires having ring-shaped configurations, wherein at least some of said plurality of wires are arranged in concentric rectangular rings.

9. The integrated circuit according to claim 8, wherein said at least some of said plurality of wires are arranged in concentric square rings.

10. The integrated circuit according to claim 8, wherein said plurality of wires having said ring-shaped configurations are arranged concentrically with one another.

11. The integrated circuit according to claim 8, wherein said plurality of contacts includes a plurality of first contacts and a plurality of second contacts located alternatingly with respect to said plurality of first contacts along a plurality of lines, said plurality of wires including a plurality of first wires and a plurality of second wires wherein each of said plurality of second wires is laterally spaced from a corresponding one of said plurality of first wires, and each of said plurality of first wires is located on one side of a corresponding one of said plurality of lines and a corresponding one of said plurality of second wires is located on the opposite side of said corresponding one of said plurality of lines.

12. The integrated circuit according to claim 8, wherein said plurality of wires includes a plurality of Vdd wires and a plurality of ground wires.

13. The integrated circuit according to claim 12, further comprising a plurality of Vddx wires.

14. The integrated circuit according to claim 8, wherein said plurality of contacts is arranged in a square pattern having diagonal symmetry and major axis symmetry, said plurality of wires arranged in concentric square rings.

15. The integrated circuit according to claim 8, wherein said power grid comprises a plurality of layers each comprising wires having longitudinal axes all extending in the same direction.

16. A device, comprising:
   a) a power supply; and
   b) an integrated circuit having at least one I/O circuit and at least one logic circuit, said integrated circuit comprising:
      i) a contact layer having a plurality of contacts in electrical communication with said power supply, said plurality of contacts are arranged in a rectangular pattern having major axis symmetry;
      ii) a power grid comprising a plurality of metal layers for providing power to said at least one I/O circuit and said at least one logic circuit;
      iii) a semiconductor device layer in electrical communication with said power grid; and
      iv) a wiring layer interposed between said contact layer and said power grid and electrically connecting at least some of said contacts with said power grid, said wiring layer including a plurality of wires each having a length extending partly along a first direction and partly along a second direction different from said first direction, wherein at least some of said plurality of wires have a ring-shaped configuration.

17. The device according to claim 16, wherein at least some of each of at least some of said plurality of wires have a ring-shaped configuration.

* * * * *